United States Patent
Gaff (10) Patent No.: US 7,560,007 B2
(45) Date of Patent: Jul. 14, 2009

(54) IN-SITU WAFER TEMPERATURE MEASUREMENT AND CONTROL

(75) Inventor: Keith Gaff, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 349 days.

(21) Appl. No.: 11/519,542

(22) Filed: Sep. 11, 2006

(65) Prior Publication Data

US 2008/0064126 A1 Mar. 13, 2008

(51) Int. Cl.
*H01L 21/306* (2006.01)
(52) U.S. Cl. .................................. 156/345.27
(58) Field of Classification Search .................. None
See application file for complete search history.

(56) References Cited

U.S. PATENT DOCUMENTS

| | | | |
|---|---|---|---|
| 5,985,035 A * | 11/1999 | Tamura et al. | 118/724 |
| 6,556,277 B2 * | 4/2003 | Pierrat | 355/53 |
| 6,907,364 B2 | 6/2005 | Poolla et al. | |
| 2004/0004990 A1 | 1/2004 | Khan | |
| 2005/0039852 A1 | 2/2005 | Roche et al. | |
| 2005/0095776 A1 | 5/2005 | Usuami | |
| 2006/0077394 A1 | 4/2006 | Suzuki et al. | |
| 2006/0228897 A1 * | 10/2006 | Timans | 438/758 |
| 2006/0238954 A1 * | 10/2006 | Ishikawa et al. | 361/234 |

OTHER PUBLICATIONS

International Search Report, 2 pages.

* cited by examiner

*Primary Examiner*—Charles D. Garber
*Assistant Examiner*—Andre' C Stevenson
(74) *Attorney, Agent, or Firm*—Martine, Penilla & Gencarella, LLP (57) ABSTRACT

Broadly speaking, the embodiments of the present invention fill the need by providing in-situ wafer temperature measuring method and apparatus. The in-situ substrate temperature measuring method and apparatus provide instant wafer temperature information to allow for continuous monitoring of the etching process. The method and apparatus also allow for instant substrate temperature control to tighten wafer-to-wafer and chamber-to-chamber process distribution. An exemplary cluster tool system is provided. The cluster tool system includes a substrate holding station for holding a substrate capable of emitting signals indicative of substrate temperature, and a processing chamber, the processing chamber being configured to receive the substrate from the substrate holding station and to run through an active process operation when the substrate is in the processing chamber. The cluster tool system also includes a signal detector for detecting the signals emitted by the substrate when the processing chamber runs through the active process operation, the signal detector being configured to collect the emitted signals indicative of the substrate temperature.

23 Claims, 9 Drawing Sheets

IN-SITU WAFER TEMPERATURE MEASUREMENT AND CONTROL

BACKGROUND

As the semiconductor industry continues to shrink feature sizes, control of critical dimension (CD) becomes increasingly important and the constraints on across-wafer CD variation become substantially more stringent. For semiconductor plasma etching processes, often multiple plasma etching chambers are used to reach the manufacturing throughput goal. Chamber to chamber matching of the etching process and maintaining consistent chamber etching performance are critical in obtaining good CD control to meet the stringent requirement.

Etch profile critical dimensions, such as line width, are affected by many factors, but most typically by the photolithography and etching processes. During an etching process, substrate temperature strongly affects the etching rate and etched profile. To achieve tight control of CDs, substrate temperature must be carefully monitored and controlled.

Traditionally, substrate temperature in an etching process chamber is not monitored in-situ. Substrate temperature is sometimes measured during hardware development or during hardware maintenance to calibrate the process temperature before beginning a new process. Typically, substrate temperature is indirectly controlled by controlling the ESC temperature. However, substrate temperature can be as much as 60° C. hotter than the surface of the ESC during the etching process due to the relatively low heat transfer coefficient for heat transfer between the wafer and the surface of the ESC compared to the heat transfer coefficient of the ESC. Therefore, the measurement of the ESC temperature makes precise control of substrate temperature impractical.

As mentioned earlier, substrate temperature is sometimes measured during hardware development or during hardware maintenance to adjust the process settings. However, during plasma etching, the electrostatic chuck (ESC), used to support substrates, can experience changes in surface roughness due to process chemistries used in the etch processes. The change in surface roughness can thus cause the contact between ESC and the wafer to change, which results in the substrate (or wafer) temperature drifting over time, even when the equipment and process setting remain unchanged. As a further problem, such temperature drifts contribute to chamber-to-chamber variation and increases the difficulty in obtaining consistent etch results from multiple chambers.

In view of the foregoing, there is a need for a mechanism of automated in-situ measurement of substrate temperature and automated adjustment of chamber process parameters to compensate for changes or differences in the substrate temperature during manufacturing. The in-situ temperature measuring mechanism and automated process parameter adjustment would allow tight CD control to meet the stringent CD requirement for advanced semiconductor manufacturing.

SUMMARY

Broadly speaking, the embodiments of the present invention fill the need by providing automated in-situ wafer (or substrate) temperature measuring method and apparatus for automated adjustment of process parameters by the etch processing tool. The in-situ wafer temperature measuring method and apparatus provide instant wafer temperature information to allow for continuous monitoring of the etching process and to allow for tight CD control. It should be appreciated that the present invention can be implemented in numerous ways, including as a process, an apparatus, or a system. Several inventive embodiments of the present invention are described below.

In one embodiment, a processing chamber is provided. The processing chamber includes an electrostatic chuck including at least one light pipe, the electrostatic chuck capable of receiving a substrate having a light sensing and temperature sensitive material on at least one spot on a backside of the substrate. The processing chamber also includes a light source coupled to the at least one light pipe, the light source being configured to supply light to the at least one light pipe so as to apply light to the at least one spot on the backside of the substrate when the substrate is present over the electrostatic chuck.

The processing chamber further includes a detector coupled to the light pipes, the detector being configured to collect light emitted from the light sensing and temperature sensitive material on the at least one spot on the backside of the substrate to determine the substrate temperature on the at least one spot on the backside of the substrate. In addition, the processing chamber includes a chamber controller based on the determined substrate temperature to adjust temperature controlling parameters of the electrostatic chuck to maintain desired substrate temperature ranges for a plurality of substrates to be processed over the electrostatic chuck.

In another embodiment, a cluster tool system is provided. The cluster tool system includes a substrate holding station for holding a substrate capable of emitting signals indicative of substrate temperature, and a processing chamber, the processing chamber being configured to receive the substrate from the substrate holding station and to run through an active process operation when the substrate is in the processing chamber. The cluster tool system also includes a signal detector for detecting the signals emitted by the substrate when the processing chamber runs through the active process operation, the signal detector being configured to collect the emitted signals indicative of the substrate temperature.

In yet another embodiment, a method of monitoring and controlling substrate temperature in-situ during processing of a substrate in a process chamber is provided. The method includes placing a substrate in the process chamber, and initiating a processing sequence in the process chamber. The method also includes collecting temperature measurement signals from the substrate to determine one or more substrate processing temperatures across one or more zones of the substrate, and determining if the one or more substrate processing temperatures are within control ranges.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE EXEMPLARY EMBODIMENTS

Several exemplary embodiments for an in-situ wafer (or substrate) temperature measuring and controlling system, method and apparatus will now be described. It will be apparent to those skilled in the art that the present invention may be practiced without some or all of the specific details set forth herein.

As described earlier, the traditional way of indirectly controlling the substrate temperature by controlling the ESC temperature does not work for advanced etching processes since ESC surface temperature is much less than the substrate temperature. This is due to the relatively low heat transfer coefficient for the heat transfer between the wafer and the surface of the ESC compared to the heat transfer coefficient of ESC, which significantly contributes to the temperature changes in the substrate. Consequently, the changes in ESC surface roughness due to the etch process chemistry worsen the temperature correlation between the ESC and the substrate from substrate-to-substrate and from chamber-to-chamber. Effective in-situ substrate temperature, under processing condition, measuring and controlling methods and apparatus can provide instant substrate temperature information and can provide instant substrate temperature control to keep production substrate temperature within a tight control limit. With improved temperature control, the wafer-to-wafer and chamber-to-chamber process variations can be minimized.

Figure 1A:
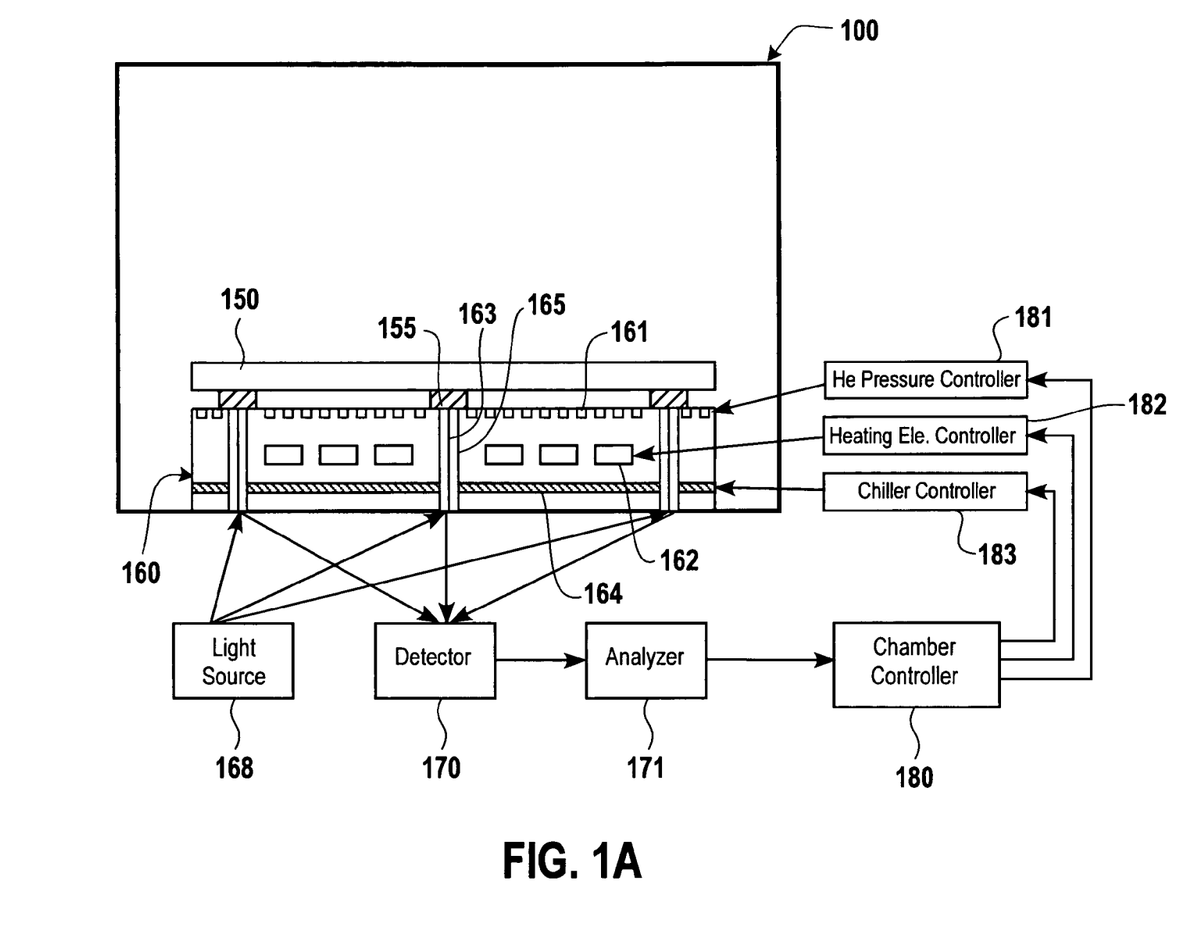
FIG. 1A shows a schematic cross-sectional diagram of one embodiment of a substrate used in-situ for process temperature measurement in a process chamber.

FIG. 1A shows an embodiment of the present invention providing a substrate 150 that can be placed on a substrate support 160 in a process chamber 100 to measure substrate temperature in-situ during processing. On the backside of the substrate 150, there are locations covered by a layer of light sensing material 155, such as Yttrium aluminium garnet (YAG) or other rare earth doped ceramics, that is sensitive to light and substrate temperature changes. The light sensing material 155 should choose material(s) that is sensitive to temperatures changes in the range about the processing temperature(s) to help determine the changes in the substrate temperature. For some etch systems, the substrate temperatures are in the range between about −10° C. to about 80° C.

Figure 1B:
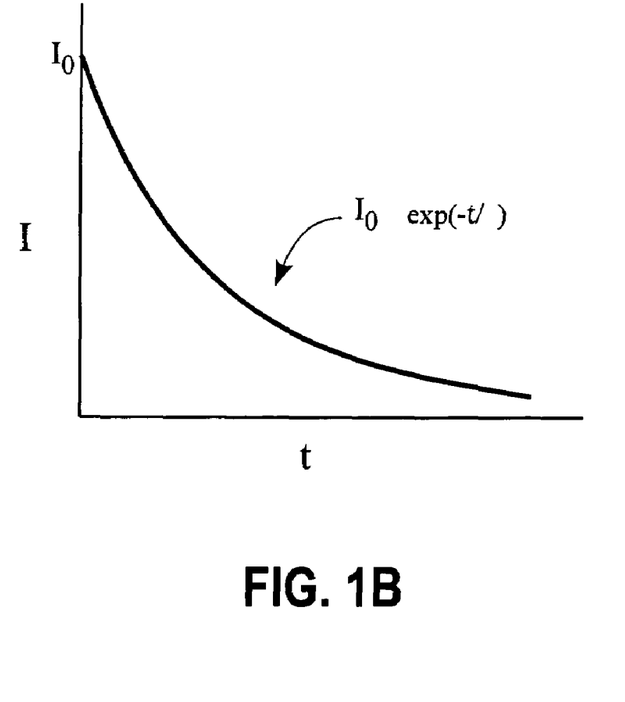
FIG. 1B shows the intensity (I) of the fluorescent light emission decays as a function of time (t).

When a light, or a light pulse, is shone on the material 155 on the substrate 150, the material 155 would emit fluorescence light with different wavelength. The intensity of emission decays once the light source is turned off. The rate of the intensity of emission decay within a period of time is dependent upon the surface temperature. Therefore, the substrate temperature can be calculated based on the characteristic decay time for the intensity of the emitted fluorescent light. FIG. 1B shows the intensity (I) of the fluorescent light emission decays as a function of time (t), as demonstrated by equation (1).

$$I = I_0 \exp(-t/\tau) \quad (1)$$

Figure 1C:
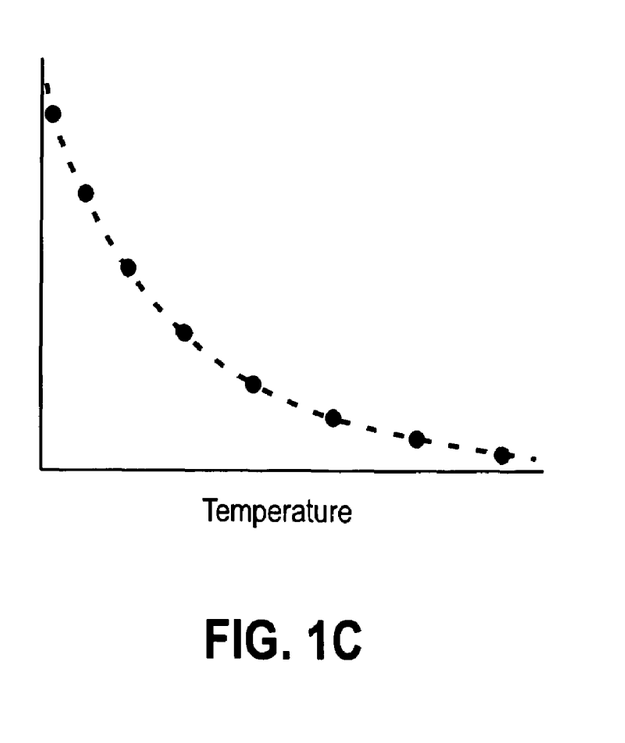
FIG. 1C shows an exemplary plot of $\tau$ as a function of temperature.

The intensity at time 0 is $I_0$. The rate of decaying is affected by a constant $\tau$ (decay time), which is a function of temperature. FIG. 1C shows an exemplary plot of $\tau$ as a function of temperature.

The in-situ substrate temperature is measured when the process used to process regular production substrate is applied on the substrate. Therefore, during the substrate temperature measurement, the process gas(es), power and other process parameters are operated in the same manner as processing a regular substrate. In the substrate support 160, there are fiber optic pipes (or light pipes) 165 positioned right below the locations with the light sensing material 155. The fiber optic pipes 165 enclose optical fibers 163 that allow light to be transferred from the light source 168 to the light sensing material 155 on the backside of the substrate 150. The fiber optic pipes 165 also encloses optical fibers 163 that allow fluorescent light emitted from the light sensing material 155 in response to the incoming light (also from optical fibers 163) to pass from material 155 to detector 170. Exemplary lights transferred from the light source 168 to the light sensing material 155 include infra-red (IR) and visible light. In one embodiment, the wavelength of the light from the light source 168 is between about 300 nm to about 1600 nm.

In one embodiment, the detector 170 converts optical signals (or light) from optical fibers 164 into electric signals, which are then processed electronically by the analyzer 171. The analyzer 171 processes the electric signals to determine the substrate temperature(s). IN one embodiment, the analyzer 171 determines the decay time ($\tau$) from the data of intensity decay as a function time. The substrate temperatures can then be determined from the dacay time ($\tau$), as described above in FIGS. 1B and 1C. The results from the analyzer 171 are then sent to a chamber controller 180. The chamber controller 180 determines if the temperature(s) is within control limit. In addition, the chamber controller 180 has software and hardware to send control signals to the controllers of electrostatic chuck (ESC) heating/cooling elements, such as ESC chiller 164, ESC heater 162 and backside He 161 in the ESC, to adjust the parameter(s) of the heating/cooling elements to bring substrate temperature within control limit(s). For example, if the temperature is too high, the chamber controller 180 can send signal to the He pressure controller 181 to increase the substrate backside He pressure in order to lower the ESC and substrate temperatures. Alternatively, the chamber controller 180 can also send signal to the heating element controller 182 to increase the heating power of the electrostatic chuck (ESC) or to the ESC chiller controller 183 to increase the temperature of the ESC coolant fluid to increase the temperatures of the ESC and substrate. Based on the exemplary mechanism described above, the substrate temperature can be monitored and controlled.

Figure 1D:
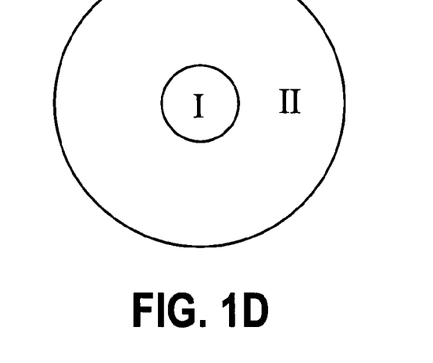
FIG. 1D shows another example of substrate temperature monitoring and controlling zones.
Figure 1E:
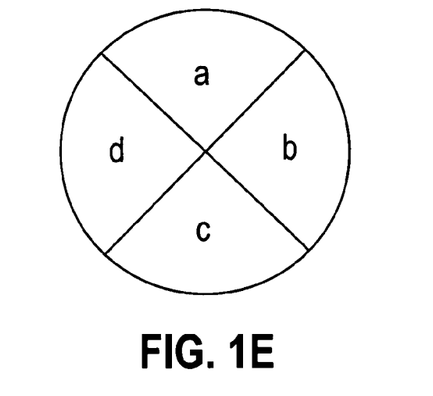
FIG. 1E shows another example of substrate temperature monitoring and controlling zones.
Figure 1F:
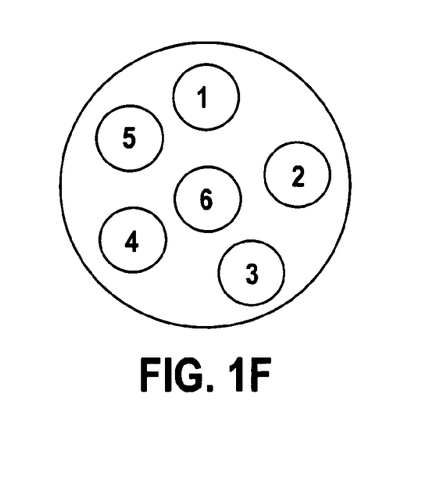
FIG. 1F shows yet another example of substrate temperature monitoring and controlling zones.

In addition, the substrate temperature can be monitored and controlled by different "zones" on the substrate. FIGS. 1D, 1E and IF show examples of different zones on the substrate. For example in FIG. 1D, there are zone I and zone II. Substrate temperatures in Zone I and Zone II can be monitored and controlled separately. Similarly, different zones in FIGS. 1E and 1F also can be monitored and controlled separately. In another embodiment, the light captured by the detector 170 is light reflected from either front-side or back-side of the substrate 150.

The substrate (or wafer) 150 used in-situ to measure substrate temperature during processing can be placed in a station or a load lock when it's not being used to measure substrate temperature, such as during regular (or normal) substrate processing. The substrate 150 may be used to measure (monitor or calibrate) substrate temperature after certain number of substrates have been processed or during chamber hardware startup or maintenance.

Figure 2:
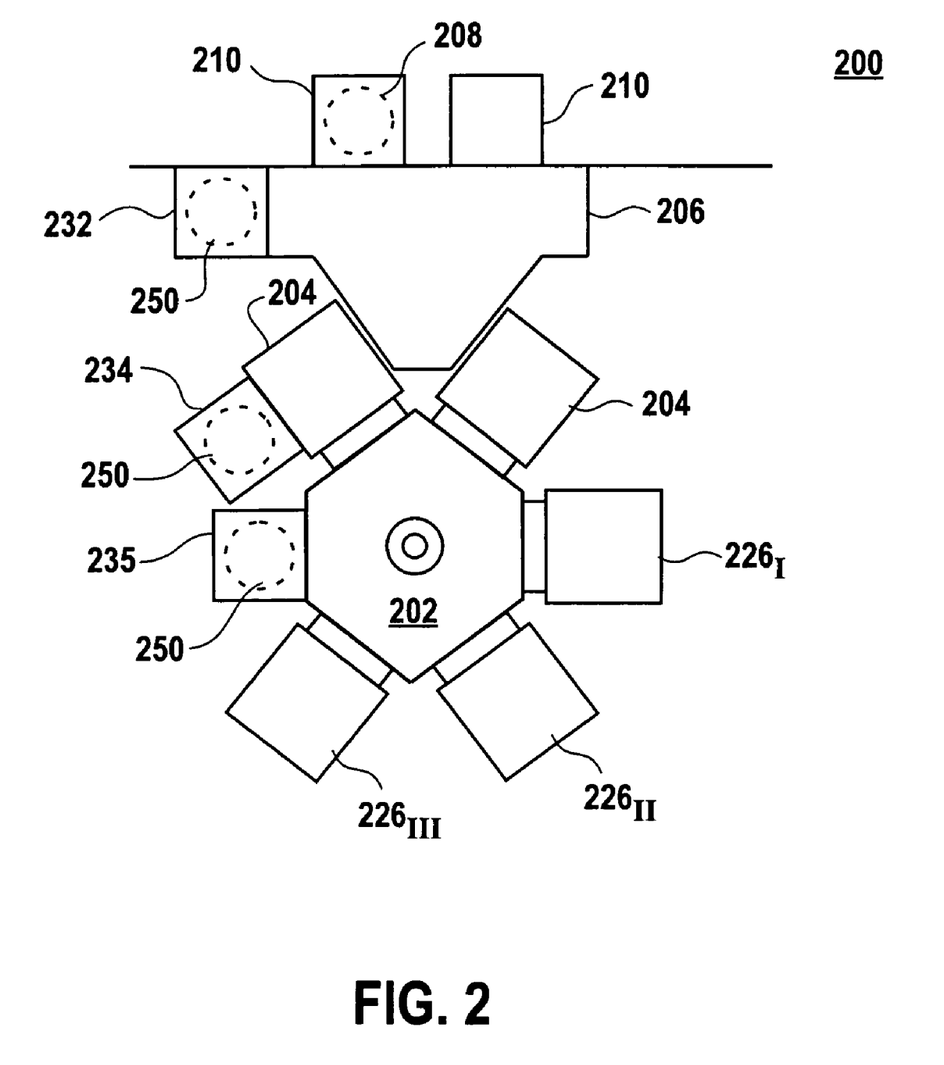
FIG. 2 shows a cluster tool with process chambers and stations or load locks to hold the substrate used for process temperature measurement.

FIG. 2 shows an embodiment of a semiconductor process cluster tool system 200 having a vacuum transport module 202, load locks 204 (or wafer transport enclosures), and an atmospheric transport module (ATM) 206 for transferring substrates, or wafers, 208 from one or more cassettes 210 to the load locks 204. In the atmospheric transport module 206, there is a front-end robot (not shown) used to transfer substrates (or wafers) between the cassettes 210 and the load locks 204. The vacuum transport module 202 also contains a robot (not shown) for transferring substrates between the load locks 204 and the process chambers $226_I$, $226_{II}$, $226_{III}$. During regular substrate processing in the process chambers $226_I$, $226_{II}$, $226_{III}$ or chamber hardware maintenance of process chambers $226_I$, $226_{II}$, $226_{III}$, the substrate 250 used for temperature measurement can be placed in a station 232 next to the atmospheric transport module (ATM) 206 or in a station 234 next to one of the load locks 204 or in station 235 coupled to the vacuum transport module 202. In one embodiment, the substrate 250 is similar to the substrate 150 shown in FIG. 1A. Alternatively, the load locks 204 can also include an additional slot to hold the substrate 250.

To measure substrate temperature during substrate processing in the process chamber, the substrate 250 can be moved from its storing location, such as station 232, station 234, or one of the load locks 204, and be placed in one of the process chambers $226_I$, $226_{II}$, or $226_{III}$ to measure the substrate temperature under substrate processing condition. The substrate temperature can be measured in-situ, instantly and directly by using the substrate and the accompanying instruments, such as a detector and an analyzer. Based on the measurement results, the substrate temperature can be categorized as within control limit(s) or outside control limit(s). If the substrate temperature(s) is within control limit, the process chamber can be "qualified" to start or resume substrate processing. If the substrate temperature is outside control limit, but still within the range that the system can respond, the hardware parameters that affect the substrate temperature, such as backside He pressure or ESC chiller temperature or heating element, can be adjusted to tune the substrate temperature to be within control limit. Alternatively, if the substrate temperature is significantly outside control limit and outside the range of temperatures over which the system can compensate, the system can send a warning (or alarm) to the operator to consider starting trouble-shooting or maintenance.

Figure 3A:
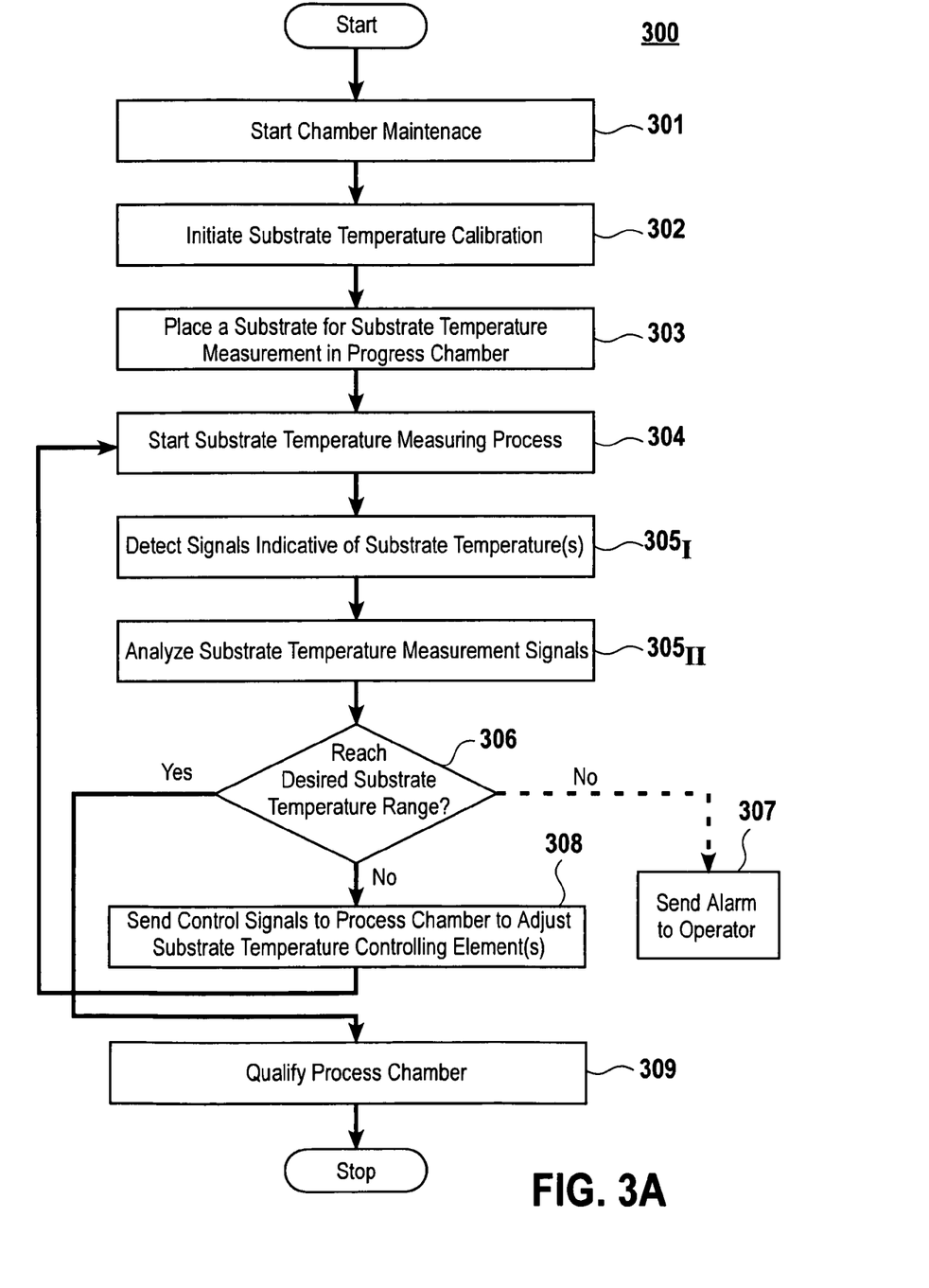
FIG. 3A shows a process flow of substrate temperature calibration process during hardware maintenance utilizing a substrate for in-situ process temperature measurement.

FIG. 3A shows an embodiment of a process flow 300 of using a substrate to measure substrate temperature in-situ to calibrate substrate temperature during processing. At step 301, the process chamber maintenance is initiated. At step 302, the substrate temperature calibration process is initiated. The substrate temperature calibration process starts by placing a substrate for temperature measurement in the process chamber at step 303. At step 304, substrate temperature measuring process is initiated. In one embodiment, the process includes initiating a processing sequence in the process chamber and passing light to the backside of the temperature monitoring substrate with a light sensing material on the substrate backside. The light sensing material upon receiving the light would emit fluorescent light, which can be detected and analyzed. At step $305_I$, the signals indicative of substrate temperature(s) are detected. At step $305_{II}$, the signals indicative of substrate temperature(s), or substrate temperature measurement signals, are analyzed. Depending on the substrate temperature measurement results, the data (or signal) analyzer decides if the measured temperature(s) has reached desired substrate temperature(s) at step 306. If the temperature(s) measured are not within the range of targeted temperature and the temperatures measured are way outside the process norm, the process can continue to step 307 to send an alarm to the operator. Or, the process can continue to step 308 by sending control signals to process chamber to adjust substrate temperature controlling elements, such as backside He pressure, ESC chiller temperature, or ESC heating element, if the temperature(s) measured is not within the range of targeted temperature(s), but is in the range that the system's adjustment can bring the temperature within the targeted range. In one embodiment, sending signals to process chamber to adjust temperature controlling elements includes determining the control set points for the temperature controlling elements.

Substrate temperature can be measured for different zones on the substrate and also be controlled by different zones as described earlier in FIGS. 1B, 1C and 1D. After the temperature controlling elements have been adjusted, the process can return to the step 304 to repeat substrate temperature measuring process. The temperature measurement and adjustment can repeat until the temperature reach desired target (or target range). If the temperatures measured are within the target range, the process can continue to step 309 and the process chamber is "qualified" for substrate processing.

Figure 3B:
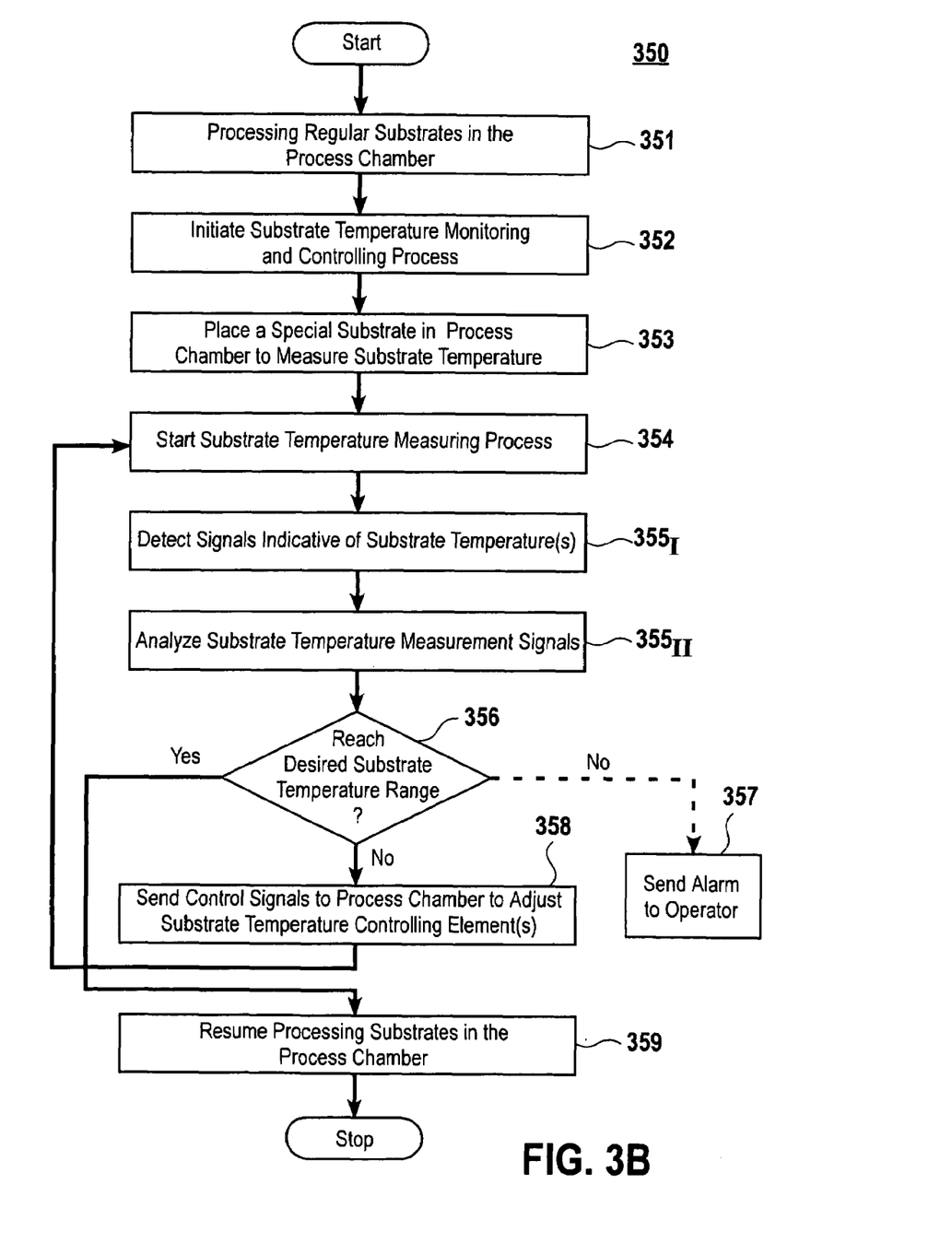
FIG. 3B shows a process flow of monitoring and controlling substrate temperature during process utilizing a substrate for in-situ process temperature measurement.

FIG. 3B shows another embodiment of a substrate temperature monitoring and controlling process flow 350. The process starts at step 351 of processing regular substrates in the process chamber. Regular substrates (or production substrates) mean substrates used to make devices. At step 352, the temperature monitoring and controlling process is initiated. In one embodiment, step 352 includes receiving signals to halt processing of regular substrates (or production substrates) to initiate temperature monitoring and controlling process. The substrate temperature monitoring process starts by placing a special substrate, for example a substrate similar to substrate 150 described earlier, in the process chamber to measure substrate temperature at step 353. At step 354, substrate temperature measuring process is initiated. In one embodiment, the process includes initiating a processing sequence in the process chamber and passing light to the backside of the temperature monitoring substrate with light sensing material on the substrate backside. The light sensing material upon receiving the light would emit fluorescent light, which can be detected and analyzed. At step $355_I$, the signals indicative of substrate temperature(s) are detected. At step $355_{II}$, the signals indicative of substrate temperature(s), or substrate temperature measurement signals, are analyzed.

Depending on the substrate temperature measurement results, the data analyzer decides if the measured temperature has reached desired substrate temperature(s) at step 356. If the temperature(s) measured is not within the range of targeted temperature and the temperature(s) measured is outside the operator specified process limits, the process can continue to step 357 to send an alarm to the operator to take necessary actions. Or, the process can continue to step 358 by sending control signals to process chamber to adjust substrate temperature controlling elements, such as backside He pressure, ESC chiller temperature, or ESC heating element, if the temperature(s) measured is not within the range of targeted temperature, but is in the range that the system's adjustment can bring the temperature within the targeted range. In one embodiment, step 358 includes deciding control set points for the substrate temperature controlling elements before sending control signals to process chamber to adjust substrate temperature controlling elements. After the temperature controlling elements have been adjusted, the process can return to the step 354 to repeat substrate temperature measuring process. The temperature measurement and adjustment can continue until the temperature(s) reaches desired temperature (or target range). If the temperature(s) measured is within the target range, the process can continue to step 359 to resume processing regular substrate in the process chamber with the new settings for Helium pressure, ESC heater set points, and/or ESC chiller temperature.

The substrate temperature calibration process of FIG. 3A and substrate temperature monitoring and controlling process of FIG. 3B can be used on multiple chambers, such as chambers $226_I$, $226_{II}$, $226_{III}$, of a cluster system, such as the one shown FIG. 2. For advanced etching, chamber-to-chamber matching is very important to achieve tight CD control. As described earlier, substrate temperature strongly affects etching performance, matching of substrate temperature during processing from chamber to chamber is critical in achieving tight CD control.

Figure 4:
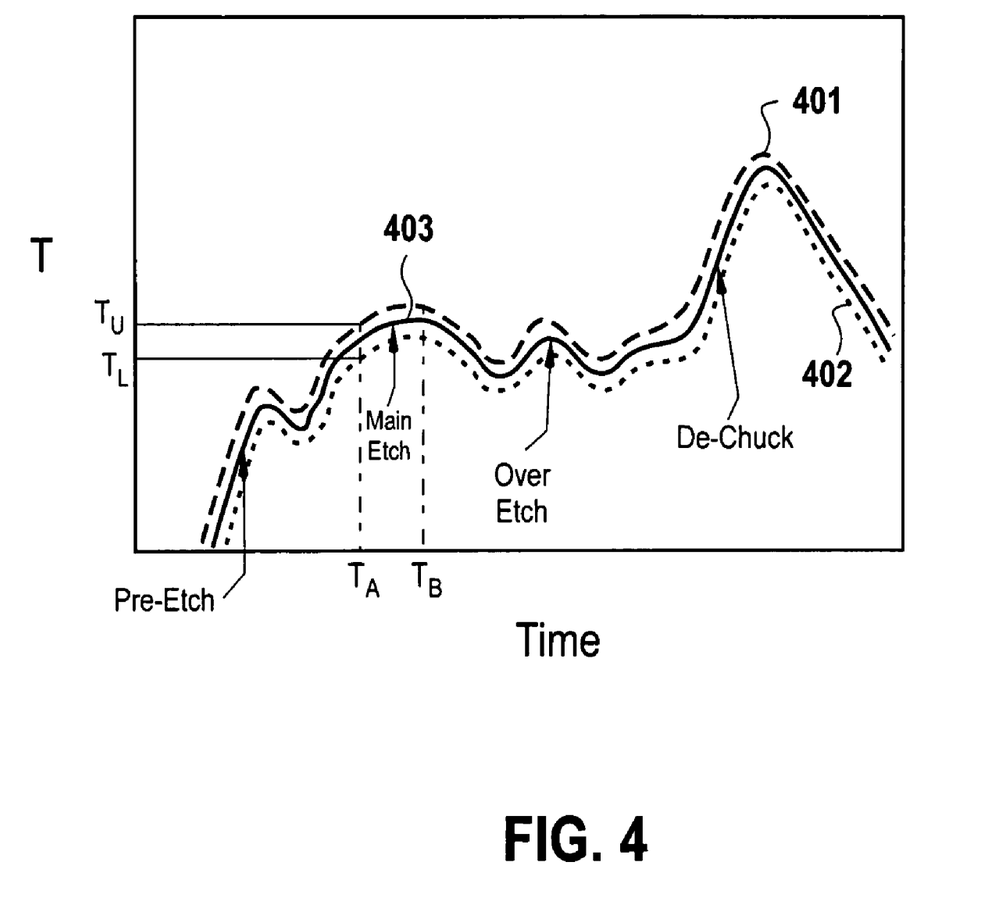
FIG. 4 shows a plot of substrate temperature variation as a function of time for an exemplary polysilicon etching process.

Regarding substrate temperature during processing, substrate temperatures go through a curve with highs and lows. FIG. 4 shows an exemplary substrate temperature profile 403 of a polysilicon etching process for a substrate. The temperature profile shows a quick temperature rise during the pre-etch step, followed by a relatively flat main etch step. During the over etch step, the substrate temperature is lower than the main etch step. Following the over etch step is the de-chuck step. During the de-chuck step, the substrate temperature rises sharply and drops sharply after the substrate is de-chucked. Using special substrate, such as substrate 150 described above, to measure the substrate temperature during processing, data collection can be applied at a particular step of the etching process, such as the pre-etch step, the main etch step, the over etch step, or the de-chuck step, or the entire etching process. If a particular step is chosen, the step chosen to be monitored typically is the step whose temperature change is most critical to the etch process performance, including critical dimension (CD) distribution. For example, etch time from $T_A$ to $T_B$ of the main etch step could be chosen to monitor substrate temperature. Control bands, based on processing data of many substrates, can be established to set acceptable control ranges. In FIG. 4, dotted curves 401 and 402 are exemplary upper and lower control curves for the polysilicon etch. The special substrate can also be used to measure substrate temperature of a particular instant during a substrate processing. For example, the substrate temperature at $T_A$ of the main etch step can be chosen to be measured to be compared to the upper control limit $T_U$ and lower control limit $T_L$. If the measured temperature is outside $T_U$ or $T_L$, the settings for the backside He 161, the ESC heater 162, or chiller 164 is adjusted to bring the substrate temperature within control limits.

In addition to using a temperature measuring substrate with a light sensing material on the substrate backside, other types of technology can also be used. For example, OnWafer Technologies, of Pleasant Hill, Calif., offers a wafer with temperature sensors, or devices that can detect substrate temperatures, on the wafer. The sensors (or devices) are built into the wafer. In one embodiment, the sensor wafer has a memory storage device on the wafer to store substrate temperature data collected by the sensors. The sensor wafer of OnWafer Technologies can be placed into a process chamber to measure substrate temperature in a manner similar to substrate 150 described above. With the sensor wafer of OnWafer Technologies, no additional light sources are needed. The sensor wafer can be placed in stations similar to station 232, 234 and also similar to the load lock 204 of FIG. 2. The sensor wafer can also be used in similar process flows described in FIGS. 3A and 3B. In addition, a sensor wafer, such as the one from OnWafer Technology, might need a battery to power the devices and memory storage device(s) on the wafer. In one embodiment, the station or load lock used to hold the sensor wafer is equipped with a battery charger.

Figure 5A:
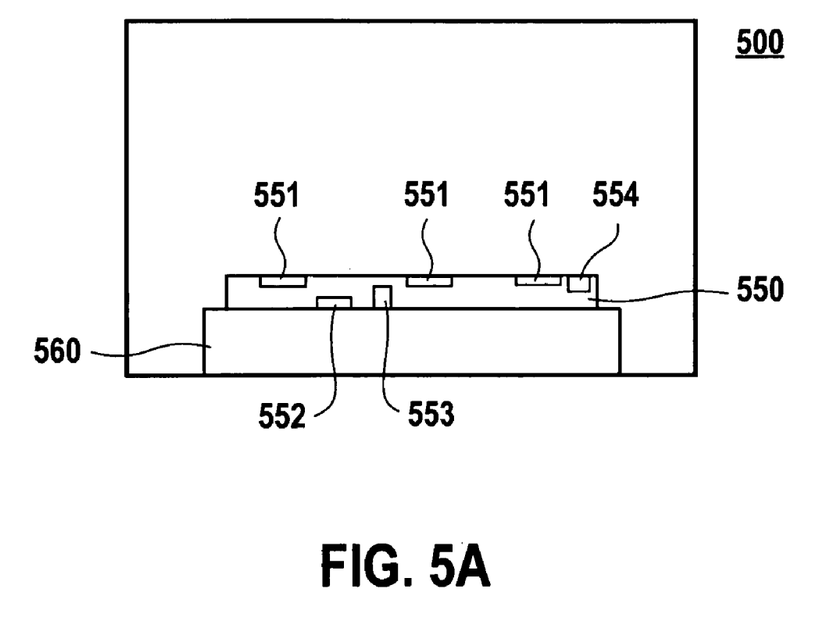
FIG. 5A shows a schematic cross-sectional diagram of another embodiment of a substrate used in-situ for process temperature measurement in a process chamber.
Figure 5B:
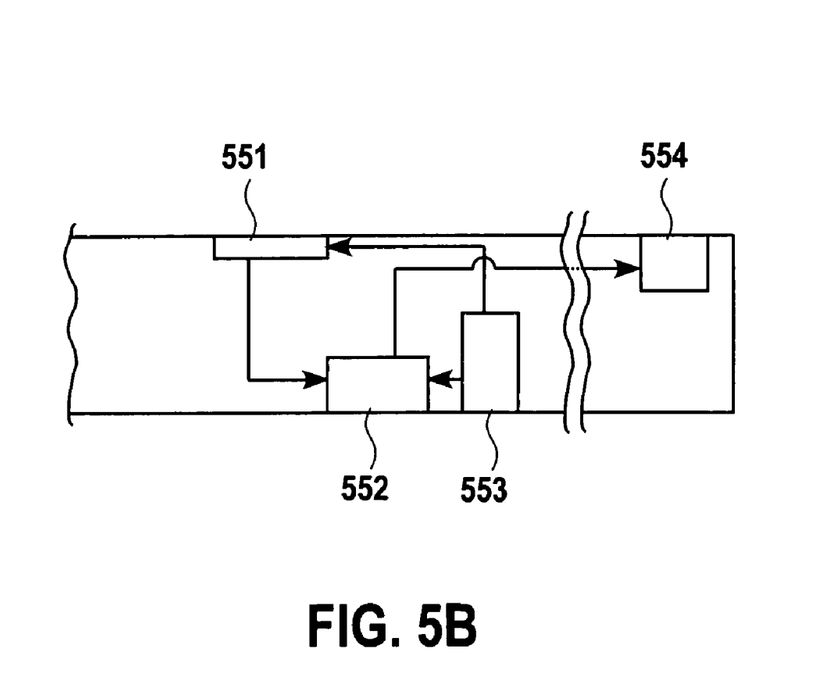
FIG. 5B shows a schematic cross-sectional view of the substrate used for in-situ temperature measurement in FIG. 5A.

FIG. 5A shows an exemplary sensor substrate 550, which is placed on an ESC 560. The substrate 550 has devices 551 for measuring substrate temperature on the substrate surface (see FIG. 5B). In one embodiment, substrate 550 has memory storage device(s) 552 that store data (or signals) collected by devices 551 for later reading. In one embodiment, the sensor substrate 550 also has a battery 553 supplying power to the devices 551 and memory storage device 552. The memory storage device 552 is coupled to a port 554 which can be a physical port, an infra-red port, or an optical port.

Figure 5C:
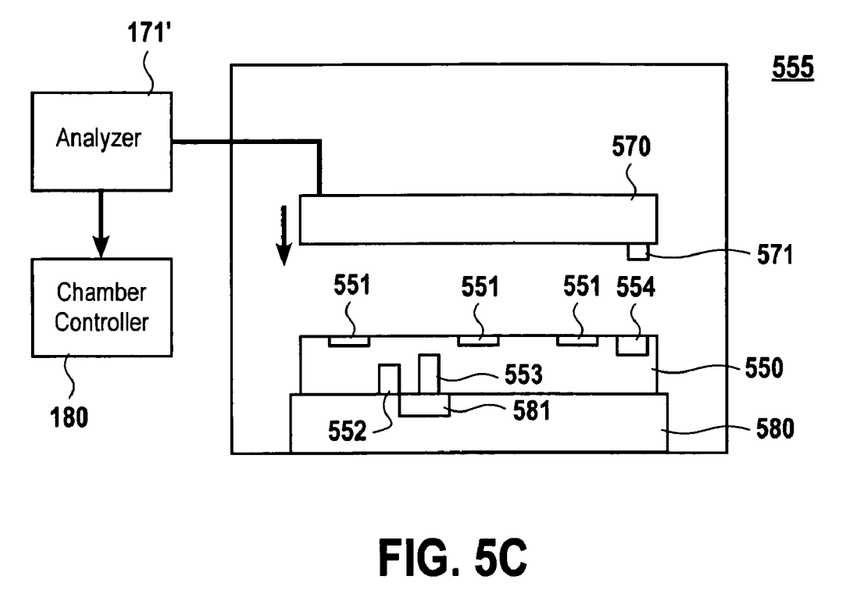
FIG. 5C shows an embodiment of a substrate holding chamber to hold the substrate used for in-situ temperature measurement in FIG. 5A.

After the sensor substrate 550 completes data collection in process chamber 500, substrate 550 is returned to its storing location (station) 555, such as station 232, station 234, or load locks 204. In its storing station (or chamber) 555, substrate 550 is placed on a battery charging station 580 that has a battery charging device 581 electrically connected to the battery 553 of substrate 550 (see FIG. 5C). The battery charging device 581 is electrically connected to the battery 553 either through physical connection or by using inductive loops to transfer power to the battery 553 on the substrate 550. In one embodiment, a signal detector 570, with probes 571, is lowered to be in contact with substrate 550. The probes 571 are electrically connected to physical port 554, which is coupled to the memory storage devices 552. In another embodiment, the signal detector 570, with probes (or signal collectors) 571, is not in physical contact with the substrate. The signal collector(s) 571 is in line of sight of the port 554 to collect infra-red or optical signals. The signals collected by detector 570 and stored in the memory storage device 552 are supplied to an analyzer 171' through the physical port 554. In another embodiment, the port 554 is an infra-red port the probes 571 emits infra-red to collect data from port 554. In one embodiment, the analyzer 171' processes the data to determine the substrate temperatures. The results from the analyzer 171' are then sent to the chamber controller 180. The results allow the chamber controller 180 to determine if the temperatures are within control limit. As described above, the chamber controller 180 has software and hardware to send control signals to the controllers of electrostatic chuck (ESC) heating/cooling elements, such as ESC heater 162, ESC coolant channels 163 and backside He 161 in the ESC, to adjust the parameter(s) of the heating/cooling elements to bring substrate temperature within control limit(s).

Figure 5D:
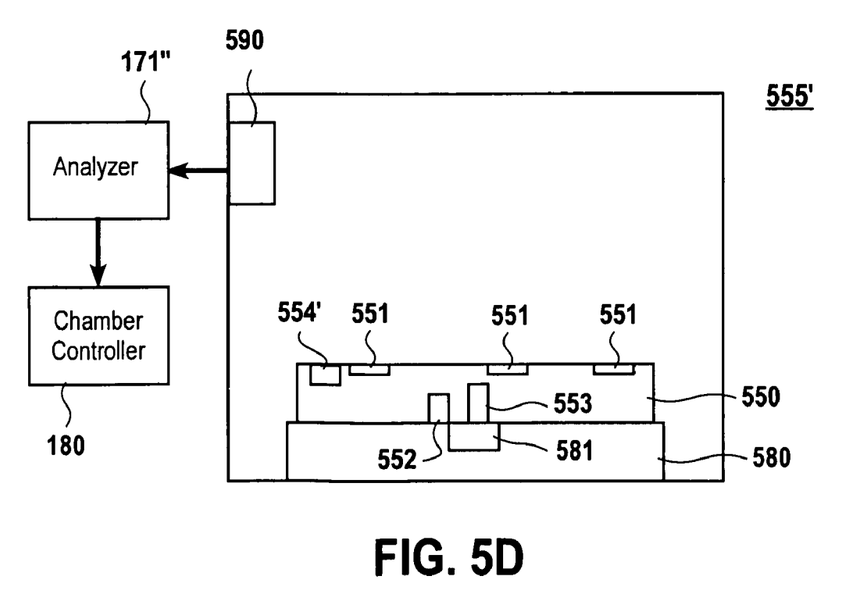
FIG. 5D shows another embodiment of a substrate holding chamber to hold the substrate used for in-situ temperature measurement in FIG. 5A.

In addition to using devices such as probes 571 of the signal detector 570 to collect data from substrate 550, wireless signal detecting (collecting) device 590 can also be used to collect data from the substrate 550 (see FIG. 5D) through a wireless port 554' on the substrate 550. Similarly, the data can be supplied to an analyzer 171" and the results from the analyzer 171" are sent to chamber controller 180 as described above.

Using a special substrate to measure temperature in-situ, accurate substrate temperature data can be collected and the temperature data can be used to more precisely control the substrate temperature during subsequent substrate processing. With more precise temperature measurement and control of the substrates, tighter CD distribution from wafer to wafer and chamber to chamber can be achieved.

The concept of the invention can be applied to any applicable systems and processes and is not limited to etching chamber and etching processes. For example, chemical vapor deposition and photoresist pre-bake systems and processes can also utilize concept of this invention. The application is most suitable for calibrating, monitoring and/or controlling processes and apparatuses whose performances are sensitive to substrate temperature.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A processing chamber, comprising:
    an electrostatic chuck including at least one light pipe, the electrostatic chuck capable of receiving a substrate having a light sensing and temperature sensitive material deposited on at least one spot on a backside of the substrate;
    a light source coupled to the at least one light pipe, the light source being configured to supply light to the at least one light pipe so as to apply a light to the light sensing and temperature sensitive material deposited on the at least one spot on the backside of the substrate when the substrate is present over the electrostatic chuck;
    a detector coupled to the at least one light pipe, the detector being configured to collect a fluorescent light emitted from the light sensing and temperature sensitive material as a result of the light being applied on the light sensing and temperature sensitive material to determine a substrate temperature on the at least one spot on the backside of the substrate, wherein the substrate temperature is determined by measuring the decay of the emitted fluorescent light after the light source is turned off; and
    a chamber controller utilizing the determined substrate temperature to adjust temperature controlling parameters of the electrostatic chuck to maintain desired substrate temperature ranges for a plurality of substrates to be processed over the electrostatic chuck.

2. The processing chamber of claim 1, further comprising:
    an analyzer configured to process the received the fluorescent light emitted from the light sensing and temperature sensitive material on the at least one spot on the backside of the substrate to determine the substrate temperature on the at least one spot on the backside of the substrate.

3. The processing chamber of claim 1, wherein the chamber controller is configured to identify if a critical temperature change has occurred in any one of the plurality of spots on the backside of the substrate, based on the determined substrate temperature.

4. A processing chamber as recited in claim 3, wherein the critical temperature change occurs when a temperature reading outside of the desired substrate temperature range is detected at one of the at least one spot on the backside of the substrate.

5. A processing chamber as recited in claim 1, wherein the temperature controlling parameters are set using one or more heating/cooling elements.

6. A processing chamber as recited in claim 5, wherein one of the heating/cooling elements is set by backside helium (He) pressure.

7. A processing chamber as recited in claim 1, wherein there are a plurality of spots on the backside of the substrate with the light sensing and temperature sensitive material, and temperature controlling parameters are adjusted in separately controlled zones correlated to the plurality of spots in the electrostatic chuck in order to individually control temperature in the separately controlled zones.

8. A processing chamber as recited in claim 1, wherein the substrate having a light sensing and temperature sensitive material on at least one spot on a backside of the substrate is placed in a station or a load lock that is coupled to a substrate transfer chamber.

9. A processing chamber as recited in claim 1, wherein the light source supplies light through optical fibers embedded in the light pipes.

10. A cluster tool system, comprising:
    a substrate holding station for holding a substrate, wherein the substrate has a light sensing and temperature sensitive material deposited on the backside of the substrate to emit a fluorescent light in response to a light being applied on the light sensing and temperature sensing material to determine a substrate temperature;
    a processing chamber, the processing chamber being configured to receive the substrate from the substrate holding station and to run through an active process operation when the substrate is in the processing chamber, wherein the processing chamber has an electrostatic chuck including at least one light pipe, the at least one light pipe being configured to pass light; and
    a detector coupled to the at least one light pipe for detecting the fluorescent light emitted by the light sensing and temperature sensitive material deposited on the backside of the substrate when the processing chamber runs through the active process operation, wherein the substrate temperature is determined by measuring the decay of the emitted fluorescent light after the light source is turned off.

11. A cluster tool system as recited in claim 10, further comprising:
    an analyzer configured to determine the substrate temperature from the fluorescent light emitted; and
    a chamber controller configured to determine if the substrate temperature is outside a control range and to adjust temperature controlling parameters of the process chamber to bring the substrate temperature within the control range for a plurality of substrates to be processed in the process chamber.

12. A cluster tool system as recited in claim 10, wherein the detector is integrated in the processing chamber.

13. A cluster tool system as recited in claim 10, wherein the fluorescent light emitted are captured by devices for measuring substrate temperature and are communicated to a memory device for later reading, the devices for measuring substrate temperature and the memory device are embedded in the substrate.

14. A cluster tool system, comprising:
a substrate holding station for holding a substrate capable of emitting signals indicative of substrate temperature,
a processing chamber, the processing chamber being configured to receive the substrate from the substrate holding station and to run through an active process operation when the substrate is in the processing chamber; and
a signal detector for detecting the signals emitted by the substrate when the processing chamber runs through the active process operation, the signal detector being configured to collect the emitted signals indicative of the substrate temperature, wherein the substrate further embeds a battery to charge the devices for measuring substrate temperature and the memory device.

15. A cluster tool system as recited in claim 14, wherein the substrate holding station comprises a battery charging station to charge the battery embedded in the substrate.

16. A cluster tool system as recited in claim 10, wherein the signal detector is integrated in the substrate holding station.

17. A cluster tool system as recited in claim 10, wherein the signal detector is a wireless device.

18. A cluster tool system as recited in claim 10, wherein the signal detector detects infra-red or optical signals.

19. A cluster tool system of claim 10, wherein the substrate holding station is coupled to a load lock, to the vacuum transfer module, or to an atmospheric transport module of the cluster tool system.

20. A method of monitoring and controlling substrate temperature in-situ during processing of a substrate in a process chamber, comprising
placing a substrate in the process chamber, wherein the substrate has a light sensing and temperature sensitive material deposited on one or more spots on a backside of the substrate;
initiating a processing sequence in the process chamber;
applying a light on the light sensing and temperature sensitive material deposited on one or more spots on the backside of the substrate;
collecting a fluorescent light emitted from the light sensing and temperature sensitive material as a result of the light being applied on the light sensing and temperature sensitive material to determine one or more substrate temperatures under substrate processing across one or more zones of the substrate, wherein the substrate temperature is determined by measuring the decay of the emitted fluorescent light after the light source is turned off; and
determining if the one or more substrate temperatures under substrate processing are within control ranges.

21. A method as recited in claim 20, further comprising:
sending control signals to the process chamber to adjust substrate temperature controlling elements if any of the one or more substrate temperatures under substrate processing is not within control ranges to bring the one or more substrate temperatures to be within control ranges.

22. A method as recited in claim 20, wherein the signals is collected for a selected time range in a selected process step during the processing sequence.

23. A method as recited in claim 22, wherein the signals is collected for a selected instant during the processing sequence.

* * * * *